United States Patent [19]

Lin

[11] Patent Number: 6,140,224
[45] Date of Patent: Oct. 31, 2000

[54] METHOD OF FORMING A TUNGSTEN PLUG

[75] Inventor: Ching-Fu Lin, Taipei, Taiwan

[73] Assignee: Worldiwide Semiconductor Manufacturing Corporation, Hsinchu, Taiwan

[21] Appl. No.: 09/293,974

[22] Filed: Apr. 19, 1999

[51] Int. Cl.[7] ........................ H01L 21/4763; H01L 21/44
[52] U.S. Cl. .......................... 438/634; 438/633; 438/627; 438/628; 438/637; 438/648; 438/643; 438/685
[58] Field of Search ........................... 438/634, 625–627, 438/628–629, 637–640, 651, 633, 643, 645, 648, 668, 671–673, 675, 685–688

[56] References Cited

U.S. PATENT DOCUMENTS

| | | | |
|---|---|---|---|
| 5,506,177 | 4/1996 | Kishimoto et al. | 438/629 |
| 5,744,394 | 4/1998 | Iguchi et al. | 438/276 |
| 5,882,999 | 3/1999 | Anderson et al. | 438/629 |
| 5,953,635 | 9/1999 | Andideh | 438/761 |
| 5,960,317 | 9/1999 | Jeong | 438/633 |
| 6,008,114 | 12/1999 | Li | 438/618 |
| 6,010,962 | 1/2000 | Liu et al. | 438/687 |

*Primary Examiner*—Charles Bowers
*Assistant Examiner*—Thanh Nguyen

[57] ABSTRACT

A dielectric layer and a polishing stop layer are respectively formed over a substrate. A glue layer composed of titanium (Ti) is formed along the surface of the dielectric layer. The Ti layer serves as adhension promotion to the subsequent TiN layer. A titanium-nitride (TiN) layer is next formed on the Ti layer to act as a barrier layer. A tungsten layer is deposited on the TiN layer. An etching back step is carried out to etch the tungsten layer, therby leaving the tungsten in the contact holes to form the tungsten plug. Non-metal or oxide CMP is used to removes tungsten residues and TiN/Ti layers and the CMP will stop on the polishing stop layer.

15 Claims, 5 Drawing Sheets

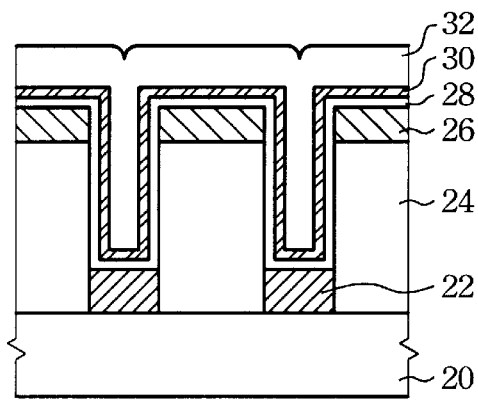
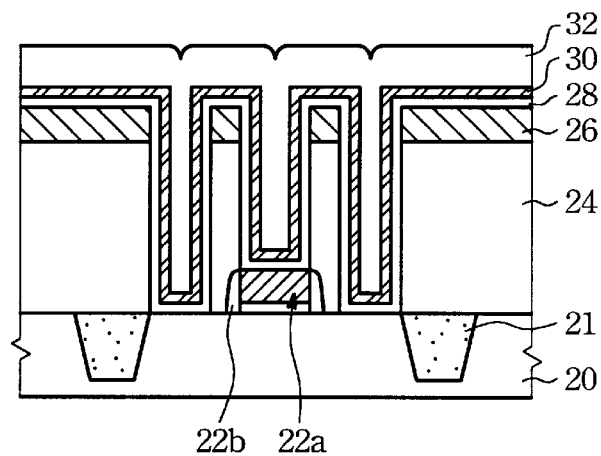
FIG.7A FIG.7B
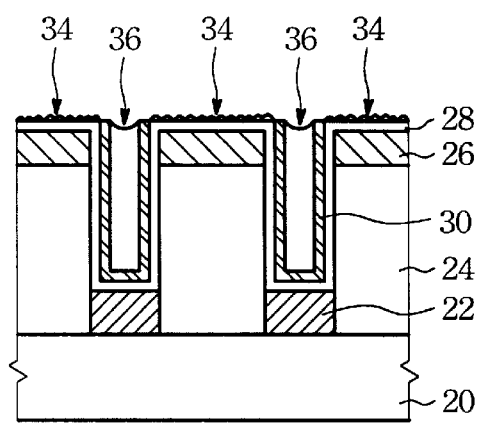
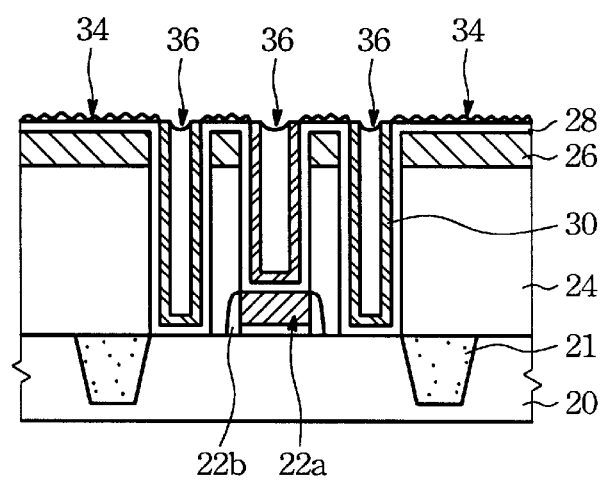
FIG.8A FIG.8B

METHOD OF FORMING A TUNGSTEN PLUG

FIELD OF THE INVENTION

The present invention relates to a process for manufacturing an electrical connection structure and more specifically, to a process for manufacturing a tungsten plug for used in integrated circuits.

BACKGROUND OF THE INVENTION

Great progress has been made in silicon IC (integrated circuit) technology. However, it has been a trend to increase the packaging density of devices. The large integration of semiconductor ICs has been accomplished by a reduction in individual device size. With this reduction of device size, many challenges arise in the manufacture of the ICs. As an example, the reduction in a DRAM cell size results in a decrease in storage capacitance leading to reliability drawbacks, such as a lower signal to noise ratio and other undesirable signal problems.

Each device requires interconnections for exchanging electrical signals from one device to another device. Therefore, ICs includes a metallization in the form of a pattern that is extends from the surface of a substrate. In the technology, the metallization extends through an opening in an isolation material and makes ohmic contact with the substrate with the substrate. As the numbers of the components in the ICs is increased, the technology towards the use of multiple level of interconnection with an isolation structure between adjacent levels. The formation of the interconnection is now even more important and the interconnection for connecting elements between semiconductor devices is becoming more critical as the ICs toward multi-level interconnections.

Typically, the interconnection or other electrically conducting elements is widely used for providing specific conducting paths in an electrical circuit. In the process of forming the electrical conducting structure over an underlying layer, it is important that the surface of the underlying layer be free of any contamination, such as moisture, particles or oxides. Further, the surface of the underlying layer must be planar for subsequent layer deposition.

Tungsten is one of the common materials used in the formation of an electrical conducting structure. Before forming a tungsten layer 10 over a underlying layer, a composition layer consisting of Ti layer 6 and TiN layer 8 must be formed along the surface of the underlying layer to act as a barrier layer. Typically, the tungsten layer 10 and the barrier layer are filled in an opening of an isolation layer 4 formed over a substrate 2, as shown in FIG. 1. A hole 12 may be formed in the tungsten layer 10 due to the step coverage relating to the deposition characteristic. A planarization process is typically employed after the tungsten layer 10 is formed to obtain smoother surface. In general, there are two ways to obtain the aforementioned purpose.

One of the methods for planrization is to etch back the tungsten layer 10 by using etching technique. The benefit of the methods is that the cost is lower than the others. However, the so-called "key-hole" phenomenon will occur after the etching, as shown in FIG. 2. A "key hole" shape opening 14 is generated by the over etching and the etching selectivity between the tungsten and the barrier layer. A number of tungsten residues 16 are remained on the surface of the substrate. This effect creates undesired tungsten particles on the surface of the tungsten layer. In addition, the etching process also causes the substrate damage.

Another way is to introduce the chemical mechanical polishing (CMP) for polishing the entire surface of the substrate. As known in the art, the CMP exhibits high selectivity between oxide and metal. An effect relating to the polishing rate that is called "dishing effect" is occurred during the polishing, as shown in FIG. 3. The phenomenon is attributed to the high polishing selectivity for the tungsten material. The polishing rate of the tungsten is higher than that of the adjacent material. Thus, hollow portions 18 is generated on the surface of the tungsten, which is referred to the "dishing effect". Although the CMP exhibits high yield accompany with high cost, there are other drawbacks for the CMP such as the alignment mark damage, scratch, erosion and the metal contamination. The oxide may be loss during the polishing.

What is required is a method of forming a tungsten layer free from particle contamination, dishing effect and so on.

SUMMARY OF THE INVENTION

A dielectric layer is formed over a substrate for isolation. Then, a polishing stop layer is formed on the surface of the dielectric layer. The polishing stop layer exhibits high resist to CMP than the dielectric layer. The polishing stop layer is selected from nitride, oxynitride, SiC, amorphous carbon, amorphous CF or BN. The polishing stop layer also acts as an etching hard mask during the plug hole etching. The dielectric layer then is etched to create openings aligned to an underlying conductive region.

A glue layer composed of titanium (Ti) is formed along the surface of the dielectric layer. The Ti layer serves as adhesion promotion to the subsequent TiN layer. A titanium-nitride (TiN) layer is next formed on the Ti layer to act as a barrier layer. The TiN layer is formed by using physical vapor deposition or chemical vapor deposition. The TiN layer is introduced to prevent the Ti layer from reacting with a subsequent process for forming tungsten. If the dielectric layer is composed of fluorine doped low k material, thus the polishing stop layer will block the fluorine in the layer to prevent the F out-diffusion from the isolation layer.

A tungsten layer is deposited by using chemical vapor deposition (CVD). An etching back step is carried to etch the tungsten layer, thereby leaving the tungsten in the contact holes to form the tungsten plug. The tungsten plug may include dishing on the surface. However, the total thickness of the titanium and titanium nitride can be controlled to make sure that the total thickness of the two layers has a dimension that is larger than the depth of the dishing. Therefore, the dishing will be eliminated during the polishing of the Ti/TiN layers. A number of tungsten residues may remain on the surface. Non-metal or oxide (touch-up) CMP is used to removes tungsten residues and TiN/Ti layers and the CMP will stop on the polishing stop layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 7A and 7B is cross sectional views of a semiconductor wafer illustrating the steps of forming a titanium, a titanium nitride and tungsten layers over a wafer in accordance with the present invention.

FIGS. 8A and 8B is cross sectional views of a semiconductor wafer illustrating the step of etching back the tungsten layer in accordance with the present invention.

DETAILED DESCRIPTION OF THE PREFERRED EMBODIMENT

A method is disclosed for particle free deposition of a tungsten layer for use as an electrical conducting structure. A polishing stop layer will be used during the formation of the electrical conducting structure to overcome the prior art problem. As will be seen below, these techniques can be used for improving the performance of an electrical conducting structure. The method can be applied to not only the via hole connection but also the contact hole connection. The via hole connection refers to the electrical connection between adjacent conductive levels. The contact hole connection refers to the connection between the substrate and a conductive structure.

First Embodiment

Figure 1:
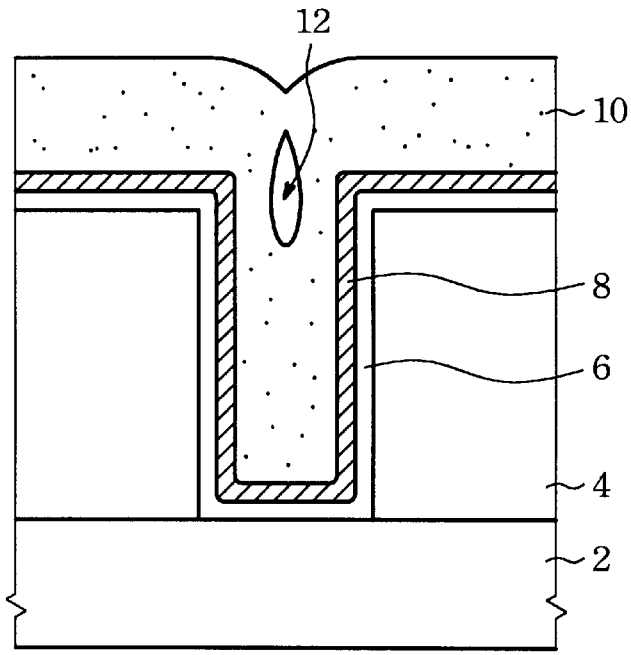
FIG. 1 is a cross sectional view of a semiconductor wafer illustrating the steps of forming a glue layer, a barrier layer and a tungsten layer over a wafer in accordance with the prior art.
Figure 2:
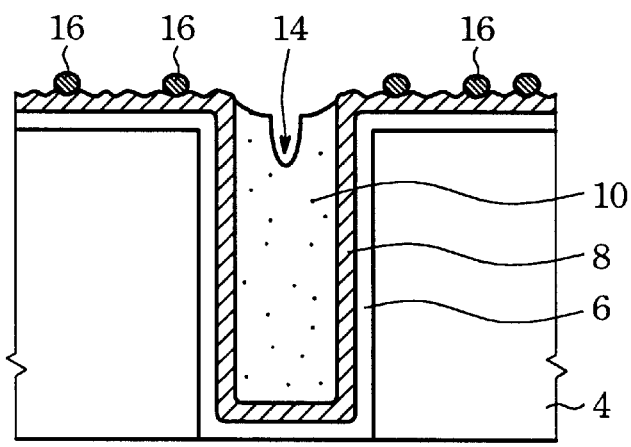
FIG. 2 is a cross sectional view of a semiconductor wafer illustrating the step of forming a keyhole after the polish of the tungsten layer in accordance with the prior art.
Figure 3:
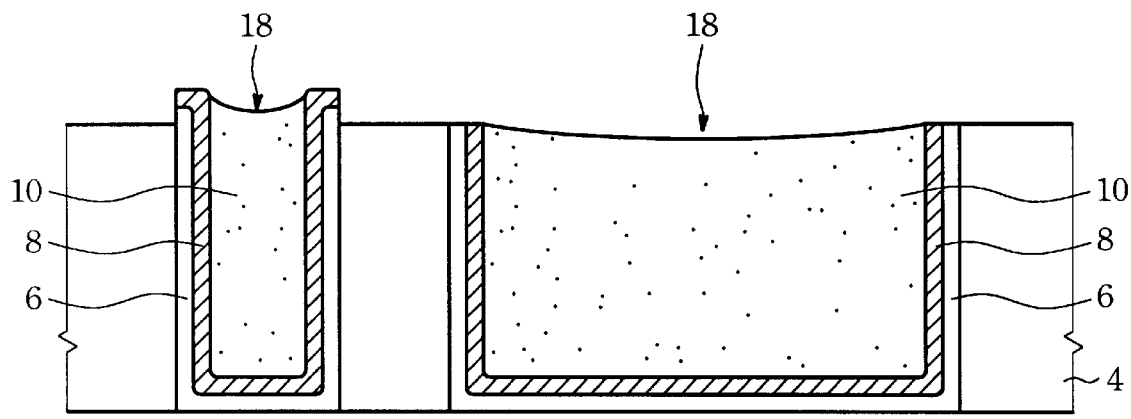
FIG. 3 is a cross sectional view of a semiconductor wafer illustrating the step of forming a dishing on the tungsten surface after the polish of the tungsten layer in accordance with the prior art.
Figures 4A, 4B:
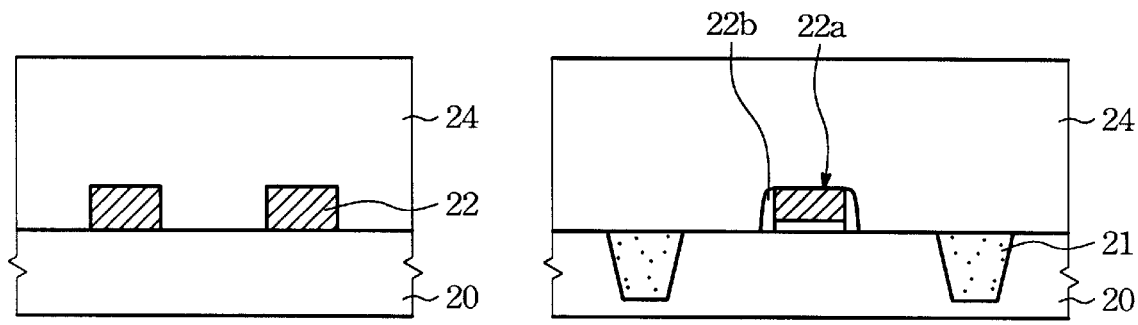
FIGS. 4A and 4B is cross sectional views of a semiconductor wafer illustrating the step of forming an isolation layer over a wafer in accordance with the present invention.
Figure 5A:
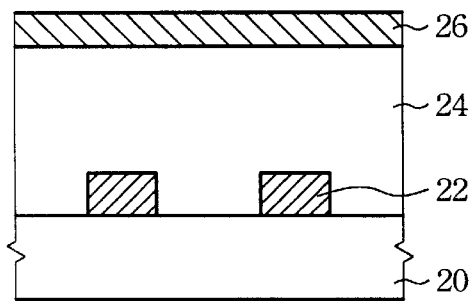
FIGS. 5A and 5B is cross sectional views of a semiconductor wafer illustrating the step of forming a polishing stop layer on the isolation layer in accordance with the present invention.

Referring to FIG. 4A, in the preferred embodiment, a semiconductor substrate 20 is provided with a <100> crystallographic orientation. A conductive pattern 22 is patterned over the substrate 20 for electrical connection. The conductive pattern 22 can be formed of metal or alloy. Next, a dielectric layer 24 is formed over the substrate for the purposes of isolation. Typically, the dielectric layer 24 is composed of silicon oxide, or the like. For example, a silicon oxide layer 24 may be formed over the substrate 2 by using a chemical vapor deposition process in an ambient including silane and other compound. Then, a polishing stop layer 26 is formed on the entire surface of the dielectric layer 24 as a resistant layer for subsequent CMP, as illustrated in FIG. 5A. The polishing stop layer 26 exhibits high resist to CMP than the dielectric layer 24. If the dielectric layer is composed of oxide, then the polishing stop layer 26 can be selected from nitride, oxynitride, SiC, amorphous carbon, amorphous CF or BN. The polishing stop layer 26 has multiple function, it also acts as an etching hard mask during the plug hole etching.

Figure 6A:
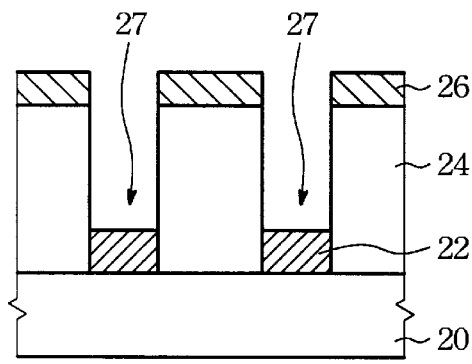
FIGS. 6A and 6B is cross sectional views of a semiconductor wafer illustrating the step of forming via or contact openings in the isolation layer in accordance with the present invention.

Turning to FIG. 6A, the dielectric layer 24 is etched to create openings 28 aligned to the above conductive pattern 22. Thus, the conductive pattern 22 is exposed. In order to form this structure, a photoresist with a pattern is formed on the polishing stop layer 26 to define the desired pattern by using lithography technique. Then, the polishing stop layer 26 is etched to have the pattern. Thereafter, the dielectric layer 24 is attack by an etchant using the patterned polishing stop layer 26 as an etching mask, thereby generating the via holes 27.

As shown in FIG. 7A, a glue layer 28 composed of titanium (Ti) is formed along the surface of the dielectric layer 24 to have a thickness of between 50 to 500 angstroms by a sputtering technique. The Ti layer 28 serves as adhesion promotion to the subsequent TiN layer and can be preferably formed by collimated procedure. The use of collimation for the deposition allows for a more effective deposition of titanium at the bottom of the via or contact holes 27. In the embodiment, the temperature of the sputtering is about room temperature, which is about 25 degrees centigrade. Further, the flow rate of argon gas in the chamber is about 10 to 2000 sccm. Other method can be used to form the titanium. For example, the titanium layer 28 can be formed by using $TiCl_4$ and $H_2$ as the source gases.

A titanium-nitride (TiN) layer 30 is formed on the glue layer 28 to act as a barrier layer. The TiN layer 30 is formed by using physical vapor deposition. Alternatively, chemical vapor deposition can form the TiN layer 30, and especially by LPCVD because such a deposition is nearly conformal. The thickness of the TiN layer 30 is approximately 100 to 1000 angstroms. In the CVD method, $TiCl_4$ and $NH_3$ are used as source gases. The TiN layer 30 is introduced to prevent the Ti layer 28 from reacting with a subsequent process for forming tungsten. Specifically, it has been found that a reaction will occur between a fluorine and titanium. The fluorine is one of the by-productor of the tungsten chemical vapor deposition (CVD). Further, if the dielectric layer 24 is composed of fluorine doped low k material, thus the polishing stop layer 26 will block the fluorine in the layer 24 to prevent the F out-diffusion from the isolation layer 24.

Still referring to FIG. 7A, a tungsten layer 32 is deposited by using chemical vapor deposition (CVD). The reaction material for forming the tungsten layer includes $WF_6$ and $SiH_4$. The TiN 30 can prevent the fluorine from penetrating. In a preferred embodiment, the temperature of the deposition ranges from 300 to 500 centigrade.

Turning to FIG. 8A, an etching back step is carried to etch the tungsten layer 32, thereby leaving the tungsten in the contact holes 28. The etching back process includes reactive ion etching (RIE) or chemical dry etching. The tungsten plug 32 may includes dishing 36 on the surface. However, the total thickness of the titanium 28 and titanium nitride 30 can be controlled or determined by the deposition parameters to make sure that the total thickness of the two layers has a dimension that is greater than the depth of the dishing 36. Thus, the dishing 36 will be eliminated during the polishing of the two layers 28, 30. It is noted that the TiN layer 30 is damage by the etching back and a number of tungsten residues 34 may remain on the surface.

Figure 9A:
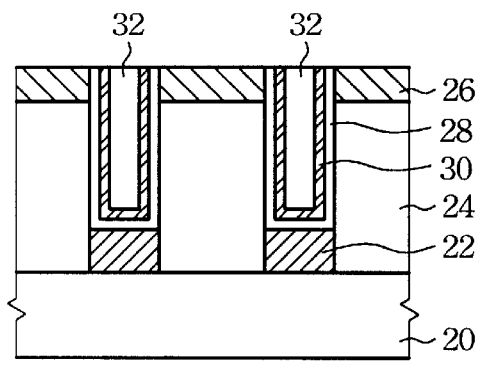
FIGS. 9A and 9B is cross sectional views of a semiconductor wafer illustrating the step of performing a non-metal chemical mechanical polishing in accordance with the present invention.

Referring to FIG. 9A, non-metal or oxide (touch-up) CMP is used to removes tungsten residues 34 and TiN/Ti layers 28, 30. The non-metal layer or dielectric (oxide) CMP refers to that the CMP is applied with a slurry, which has a trend to attack the dielectric material such as oxide more fast than the metal material. In the other words, the polishing rate to the oxide is higher than the one to the metal. Thus, the Ti/TiN layers are removed under a well controlled condition and the tungsten residues are removed. The CMP stops on the polishing stop layer 26.

Second Embodiment

The embodiment is applied to the formation of a contact structure between the substrate to the adjacent conductive layer. Referring to FIG. 4B, in the preferred embodiment, a semiconductor substrate 20 is provided with a <100> crystallographic orientation. Isolation regions 21 are formed in the substrate 20 to separate the active region. As known the art, there are two type of popular methods to form the isolation region 21, one is the so-called field oxide (FOX) technique and the other refers to the shallow trench isolation (STI). In the case of FOX, the FOX regions 21 are created via a photoresist and dry etching to define a silicon nitride-silicon dioxide composite layer. After the photoresist is removed and wet clean process, thermal oxidation in an oxygen ambient is performed using the composite layer as a hard mask to form the FOX regions 21. The silicon nitride layer is then typically removed using hot phosphoric acid solution while the silicon dioxide is removed by using diluted HF or BOE solution. The STI relates to create a trench in the substrate 20. Then, a trench filling material is provided into the trench for isolation.

A device such as transistor 22a having spacers 22b is formed over the substrate 20. Typically, the transistor 22a is composed of polysilicon or the like. Next, a dielectric layer 24 is formed over the substrate for the purposes of isolation. Typically, the dielectric layer 24 is composed of silicon oxide or the like. Any method such as chemical vapor deposition can be used to deposit the dielectric layer 24. A chemical vapor deposition process in an ambient including silane can be applied to this step. In addition, a so-called TEOS procedure can be employed.

Figure 5B:
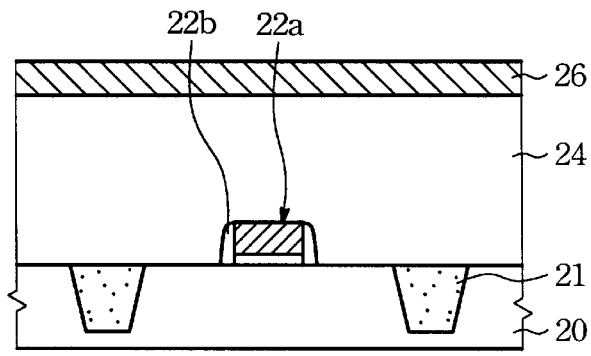

Next step is to deposit a polishing stop layer 26 on the surface of the dielectric layer 24, as shown in FIG. 5B. The polishing stop layer 26 acts as a polishing stopper for a CMP process due to the layer 26 exhibits high resist to CMP than the dielectric layer 24. Assume that the dielectric layer 24 is composed of oxide, then the polishing stop layer 26 can be selected from nitride, oxynitride, SiC, amorphous carbon, amorphous CF or BN. The polishing stop layer 26 also acts as an etching hard mask during the plug hole etching and a block to prevent the fluorine from diffusing out of the dielectric layer 24, if the dielectric layer includes fluorine doped therein.

Figure 6B:
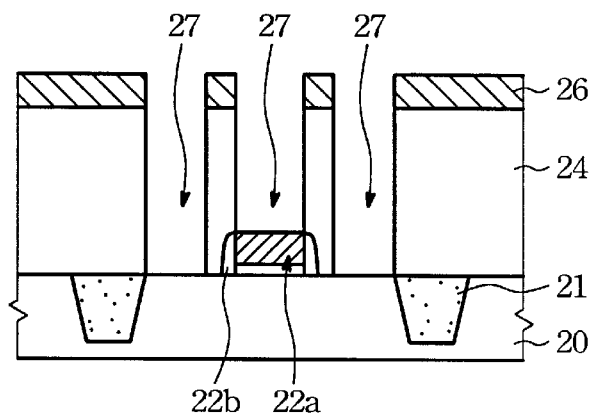

Turning to FIG. 6B, the contact openings 27 are exposed by patterning over the dielectric layer 24 with the photolithography procedure. Thus, the gate, source and drain regions are exposed by the contact openings 27. In the procedure, a photoresist is applied and hardened to withstand the subsequent dry etching. Thereafter, the dielectric layer 24 is attack by an etchant using the patterned polishing stop layer 26 or the original photoresist as mask, thereby generating the contact openings 27. Following the etching step, a clean step such as oxygen ashing is used to remove the residual photoresist on the layers.

As shown in FIG. 7B, an adhesion or glue layer 28 composed of titanium (Ti) can be deposited via collimated, r.f. sputtering along the surface of the dielectric layer 24 and the surface of the openings 28. For example, the Ti with a thickness of between 50 to 500 angstroms is formed by a sputtering technique. In the preferred embodiment, the temperature of the sputtering is about room temperature, which is about 25 degrees centigrade. Further, the flow rate of argon gas in the chamber is about 100 to 2000 sccm. Other method can be used to form the titanium. For example, the titanium layer 28 can be formed by using $TiCl_4$ and $H_2$ as the source gases. The Ti layer 28 provides low resistance contact to the doped substrate and also serves as adhesion to the subsequent TiN layer.

After the Ti 28 is formed as the liner in the contact holes 27 and on the dielectric layer 24, a barrier layer of titanium-nitride (TiN) layer 30 is formed on the titanium layer 28 using the physical vapor deposition. The thickness of the TiN layer 30 is approximately 100 to 1000 angstroms. Alternatively, chemical vapor deposition can form the TiN layer 30. In the method, $TiCl_4$ and $NH_3$ are used as source gases. As mentioned, the TiN layer 30 offers protection to the underlying layer during the subsequent tungsten deposition. The TiN layer 30 is introduced to prevent the Ti layer 28 from reacting with a subsequent tungsten material. Further, if the dielectric layer 24 is composed of fluorine doped low k material; thus the polishing stop layer 26 will block the fluorine in the layer 24 to prevent the F out-diffusion from the isolation layer 24.

Still referring to FIG. 7B, a tungsten layer 32 is deposited by using chemical vapor deposition (CVD). The reaction material for forming the tungsten layer includes $WF_6$ and $SiH_4$. The TiN 30 can prevent the fluorine generated by the CVD from penetrating. In a preferred embodiment, the temperature of the deposition ranges from 300 to 500 centigrade.

Figure 9B:
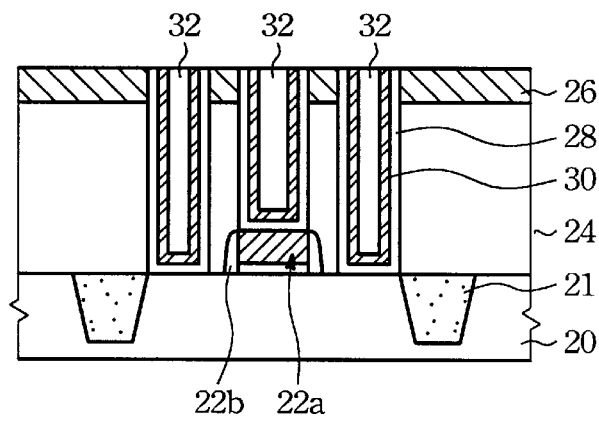

Turning to FIG. 8A, an etching back step is carried to etch the tungsten layer 32 that extends over the titanium nitride 30 layer. The surface of the tungsten plug 32 may includes dishing 36 formed thereon. By controlling the parameters as above suggest, the dishing 36 problem can be overcame during the polishing of the two layers 28, 30. It is noted that the TiN layer 30 is damage by the etching back and a number of tungsten residues 34 may remain on the surface. Referring to FIG. 9B, non-metal or oxide (touch-up) CMP is used to removes tungsten residues 34 and TiN/Ti layers 28, 30. Thus, the CMP will stop on the polishing stop layer 26.

The present invention includes an etching back step and a non-metal CMP process to form the tungsten plug. The benefits of the present invention are that the loss of the oxide is reduced. The process is achieved with low cost, low metal contamination, low scratch. It also avoids the alignment mark damage and blocks the fluorine diffusion from the isolation layer.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming an electrically conducting structure over a semiconductor wafer, said method comprising the steps of:
   forming a dielectric layer over said semiconductor wafer for isolation;
   forming a polishing stop layer on said dielectric layer;
   etching said polishing stop layer and said dielectric layer to form an opening aligned to an underlying conductive region;
   forming a titanium (Ti) layer on said polishing stop layer and on a surface of said opening to act as an adhesive layer;

forming a titanium-nitride (TiN) layer on said Ti layer to act as a barrier layer;

forming a tungsten layer on said TiN layer;

performing an etching back process to etch said tungsten layer to a surface of said titaniun nitride layer, tungsten residules being formed on a surface of said titanium nitride layer;

polishing said titanium nitride layer, said titanium layer by using a chemical mechanical polishing (CMP) with a slurry for removing dielectric, thereby removing said tungsten residules and said CMP being stop on said polishing stop layer.

2. The method of claim 1, further comprising controlling the total thickness of said titanium and thitanium nitride layers during the formation of said titanium and thitanium nitride layers such that said total thickness with a dimension that is greater than a depth of a dishing formed by said etching.

3. The method of claim 1, wherein said dielectric layer comprises oxide.

4. The method of claim 1, wherein said polishing stop layer comprises nitride.

5. The method of claim 1, wherein said polishing stop layer comprises oxynitride.

6. The method of claim 1, wherein said polishing stop layer comprises SiC.

7. The method of claim 1, wherein said polishing stop layer comprises amorphous carbon.

8. The method of claim 1, wherein said polishing stop layer comprises amorphous CF.

9. The method of claim 1, wherein said etching back process comprises reactiv ion etching (RIE).

10. The method of claim 1, wherein said etching back process comprises chemical dry etching.

11. The method of claim 1, wherein said chemical mechanical polishing (CMP) with said slurry for removing oxide material.

12. A method of forming an electrically conducting structure over a semiconductor wafer, said method comprising the steps of:

proiding a conductive region on said semiconductor wafer;

forming an oxide layer over said semiconductor wafer for isolation;

forming a polishing stop layer on said dielectric layer, wherein said polishing stop layer is selected from a group consisting of nitride, oxynitride, SiC, amorphous carbon and amorphous CF;

etching said polishing stop layer and said dielectric layer to form an opening aligned to said conductive region;

forming a titanium (Ti) layer on said polishing stop layer and on a surface of said opening to act as an adhesive layer;

forming a titanium-nitride (TiN) layer on said Ti layer to act as a barrier layer;

forming a tungsten layer on said TiN layer;

performing an etching back process to etch said tungsten layer to a surface of said titaniun nitride layer, tungsten residules being formed on a surface of said titanium nitride layer;

polishing said titanium nitride layer, said titanium layer by using a chemical mechanical polishing (CMP) with a slurry for removing oxide material, thereby removing said tungsten residules and said CMP being stop on said polishing stop layer.

13. The method of claim 12, further comprising controlling the total thickness of said titanium and thitanium nitride layers during the formation of said titanium and thitanium nitride layers such that said total thickness with a dimension that is greater than a depth of a dishing formed by said etching.

14. The method of claim 12, wherein said etching back process comprises reactiv ion etching (RIE).

15. The method of claim 12, wherein said etching back process comprises chemical dry etching.

* * * * *